(12) United States Patent
Cai

(10) Patent No.: US 6,204,733 B1
(45) Date of Patent: Mar. 20, 2001

(54) MULTIPLE-PHASE-INTERPOLATION LC VOLTAGE-CONTROLLED OSCILLATOR

(75) Inventor: Yijun Cai, San Jose, CA (US)

(73) Assignee: Vitesse Semiconductor Corp., Camarillo, CA (US)

( * ) Notice: Subject to any disclaimer, the term of this patent is extended or adjusted under 35 U.S.C. 154(b) by 0 days.

(21) Appl. No.: 09/364,974

(22) Filed: Jul. 31, 1999

Related U.S. Application Data

(60) Provisional application No. 60/094,903, filed on Jul. 31, 1998.

(51) Int. Cl.[7] .................................................. H03B 5/12
(52) U.S. Cl. .............................. 331/108 B; 331/117 FE; 331/135; 331/177 R
(58) Field of Search .......................... 331/108 B, 117 FE, 331/117 R, 135, 167, 168, 177 R

(56) References Cited

U.S. PATENT DOCUMENTS

| | | | |
|---|---|---|---|
| 3,691,475 | 9/1972 | Mouri et al. | 331/8 |
| 4,128,817 | 12/1978 | Gomi | 331/177 R |
| 4,884,041 | 11/1989 | Walker | 331/57 |

OTHER PUBLICATIONS

K.E. Syed and A. Abidi, "Gigahertz Voltage–Controlled Ring Oscillators", Electronics Letters, vol. 22, No. 12, pp. 677–679, Jun. 5, 1986.

N. Nguyen and R. Meyer, "A 18 GHz Monolithic LC Voltage–Controlled Oscillator", IEEE J. Solid–State Circuits, vol. 27, No. 3, pp. 444, Mar. 1992.

Primary Examiner—Siegfried H. Grimm
(74) Attorney, Agent, or Firm—Christie, Parker & Hale, LLP

(57) ABSTRACT

A phase interpolation voltage controlled oscillator (VCO). In one embodiment, the VCO is a multiple phase interpolation VCO. The multiple phase interpolation VCO includes a plurality of phase shifting cells each receiving an oscillating signal, and each phase shifting the oscillation signal a different amount. Summing cells receive the phase shifted oscillating signals and combine the signals to determine an output oscillating signal. In one embodiment, further summing cells receive the output of other summing cells to determine the output oscillating signal.

7 Claims, 6 Drawing Sheets

MULTIPLE-PHASE-INTERPOLATION LC VOLTAGE-CONTROLLED OSCILLATOR

CROSS REFERENCE TO RELATED APPLICATIONS

This application claims the benefit of the priority date of provisional Application No. 60/094,903, filed Jul. 31, 1998, entitled "2.5 GHz Multiple-Phase-Interpolation LC Voltage Controlled Oscillator," which is hereby incorporated by reference as if fully set forth herein.

BACKGROUND OF THE INVENTION

The present invention relates generally to voltage-controlled oscillators, and more particularly to methods and devices for LC voltage-controlled oscillators.

Oscillators are widely used to provide clock signals in digital systems. In many applications the frequency or phase of the clock signal may require adjustment. An example of such an application is a receiving unit in a digital data communication system. The transmission of data in digital form is widely performed. An important consideration in the transfer of digital data is the speed at which data is transferred. Including a clock signal with data being transferred reduces the bandwidth available for transmission of data. Accordingly, in order to recover transmitted data, receiving units often require a means of synchronizing an internal clock of the receiving unit to the frequency and phase of the received data.

Controllable oscillators are often used to provide a clock signal for the receiving unit. Controllable oscillators, such as voltage controlled oscillators (VCOs), are adjustable in both frequency and phase, and therefore may be conforming to the frequency and phase of the received data. Consequently, voltage controlled oscillators are widely used in communication systems, particularly in applications such as phase locked loops (PLLs) and clock recovery circuits (CRCs).

These communication systems often use monolithic integrated circuits. Monolithic integrated circuits, however, are subject to process variations, such as temperature variations, which affect circuit components. The process variations affect the performance, including the tuning frequency, of oscillators incorporated on chip.

One type of VCO which may provide clock signals at a range of frequencies is an LC oscillator using diode varactors. Diode varactors provide an adjustable capacitance, which enables adjustment of the oscillator frequency. LC oscillators using diode varactors, however, are not without problems. For example, diode varactors sometimes have a limited linear voltage-to-current range, which increases design difficulties if the linear range is not sufficiently large for desired purposes. Further, process variations, such as temperature variations, in forming diode varactors in integrated circuits may result in less than desired VCO performance.

A voltage-controlled LC-tuned oscillator based on interpolating two different delay paths has been reported in N. Nguyen and R. Meyer, "A 1.8 GHz Monolithic LC Voltage-Controlled Oscillator," IEEE J. Solid-State Circuits, Vol. 27, No. 3, pp. 444, March 1992, which is hereby incorporated by reference for all purposes. This voltage-controlled LC-tuned oscillator, however has a structural conflict between the VCO tuning range and the resonator Q value.

A ring oscillator is sometimes used in a VCO. A ring oscillator is a ring of delay cells whereby the oscillator frequency is changed by changing the delay of each delay cell. Ring oscillators may provide extended tuning range, but ring oscillators also often have high phase noise since each stage of a ring oscillator introduces noise into the system due to a lack of a high Q element in the delay cells.

SUMMARY OF THE INVENTION

The present invention provides a phase interpolation voltage controlled oscillator. The voltage controlled oscillator includes a plurality of phase shifting cells. The phase shifting cells receive a common input and output a phase shifted output signal which is phase shifted with respect to the common input signal. Each phase shifting cell phase shifts the output signal a different amount than the other phase shifting cells. A summing cell receives the phase shifted output signals of at least two phase shifting cells and outputs a signal representative of the sum of the phase shifted output signals. In one embodiment there are n phase shifting cells and n−1 levels of summing cells, with a first level of summing cells receiving the phase shifted output signals and the remaining levels of summing cells receiving signals representative of the sum of the phase shifted output signals provided by other summing cells.

In one embodiment, the present invention provides a voltage controlled oscillator providing an oscillating signal, with the frequency of the oscillating signal controlled within a tuning range of frequencies about a center frequency. In the voltage controlled oscillator, phase shifting cells comprised of LC tanks having resonant frequencies either less than or greater than the center frequency provide phase shifted signals to summing cells which comprise summing cell LC tanks having approximately zero phase shift about the center frequency. In one embodiment, the summing cell comprises a modified Gilbert cell, with the modification being the use of a LC tank at a summing of the Gilbert cell.

BRIEF DESCRIPTION OF THE DRAWINGS

These and other features, aspects, and advantages of the present invention will become better understood with regard to the following description, appended claims, and accompanying drawings where:

FIG. 3b shows an LC tank of the phase shifting delay cell of FIG. 3a;

FIG. 3c shows the transfer function for the phase shifting delay cell of FIG. 3a;

FIG. 4b shows a series RLC tank of the summing cell of FIG. 3a;

DETAILED DESCRIPTION

Figure 1:
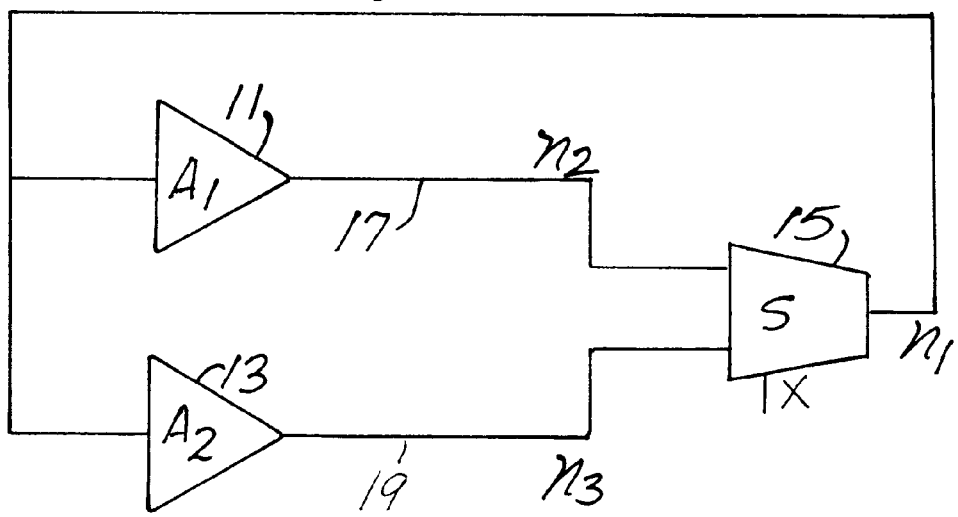
FIG. 1 illustrates a block diagram of one embodiment of a phase-interpolation VCO (PI VCO) with two phase shifting delay cells and a summing cell.

FIG. 1 illustrates a block diagram of one embodiment of a phase-interpolation VCO (PI VCO) of the present invention. The PI VCO includes two types of functional cells: A cells and S cells. As illustrated, a first A cell (A$_1$) 11 and a second A cell (A$_2$) 13, generate a first phase shifted signal 17 and a second phase shifted signal 19, respectively. The first and second phase shifted signals are signals which have a different phase shift with respect to one another when a signal at a given frequency is applied to both the first A cell and the second A cell. The A cells, therefore, are phase shifting delay cells.

An S cell 15 receives the first and second phase shifted signals and forms an output summing signal by summing the phase shifted signals. The summation is accomplished in a weighted manner, with the S cell also receiving a control signal 18 determining the relative weighting of the two phase shifted signals. The output summing signal is provided as an input to the two A cells.

The embodiment of FIG. 1 may be further understood by considering the effect of applying a signal $e^{j\omega_0 t}$ at the output of the S cell. The signal $e^{j\omega_0 t}$ has an amplitude of one, a frequency of $\omega_0$ and an initial phase of zero. Applying the signal $e^{j\omega_0 t}$ at the output of the S cell results in application of the signal $e^{j\omega_0 t}$ to the first and second phase shifting delay cells. In general, a phase shifting delay cell outputs a signal which is phase shifted and has a modified amplitude when compared to the input signal. The amount of phase shift is dependent on the frequency of the input signal, and may be written as $\phi(\omega_0)$. Accordingly, application of the signal $e^{j\omega_0 t}$ to the first A cell results in the first A cell outputting a signal $a_1 e^{j(\omega_0 t + \phi_1(\omega_0))}$ as the first phase shifted signal. Similarly, application of the signal $e^{j\omega_0 t}$ to the second A cell results in the second A cell outputting a signal $a_2 e^{j(\omega_0 t + \phi_2(\omega_0))}$ as the second phase shifted signal.

The summing cell S, in turn, combines the first and second phase shifted signals. The summing cell S, in performing the combination, additionally makes use of the control signal, which may be denoted as x, to the summing cell S. In weighting the contributions of the first and second phase-shifted signals, the condition of oscillation requires that this combined signal should equal the original signal $e^{j\omega_0 t}$ which gives:

$$[x(a_1 e^{j\phi_1(\omega_0)}) + (1-x) a_2 e^{j\phi_2(\omega_0)}] e^{j\phi_s(\omega_0)} = 1 \qquad (1)$$

where $\phi_s(\omega_0)$ is the phase shift due to the summing cell S.

Figure 2:
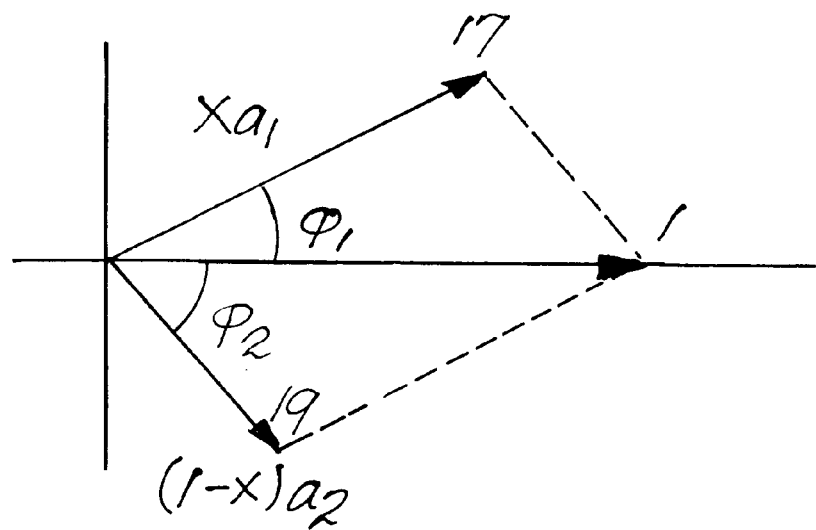
FIG. 2 shows a vector diagram of a normalized summation signal output from the summing cell of FIG. 1.

This is graphically represented in FIG. 2, assuming that $\phi_s(\omega_0) = 0$. FIG. 2 shows the vector diagram of a normalized summation signal after summing output signals from the first and second A cells. An output signal from the first A cell is represented by an upward vector with magnitude $xa_1$ and phase angle $\phi_1$. An output signal from the second A cell is represented by a downward vector with magnitude $(1-x)a_2$ and phase angle $\phi_2$. For a particular control signal x, if there is a frequency $\omega_0$ that satisfies equation (1), oscillation will occur at $\omega_0$. By adjusting the value of x, the VCO is tuned to oscillate at a frequency that is between the resonant frequency of the first A cell and the resonant frequency of the second A cell.

Figure 3A:
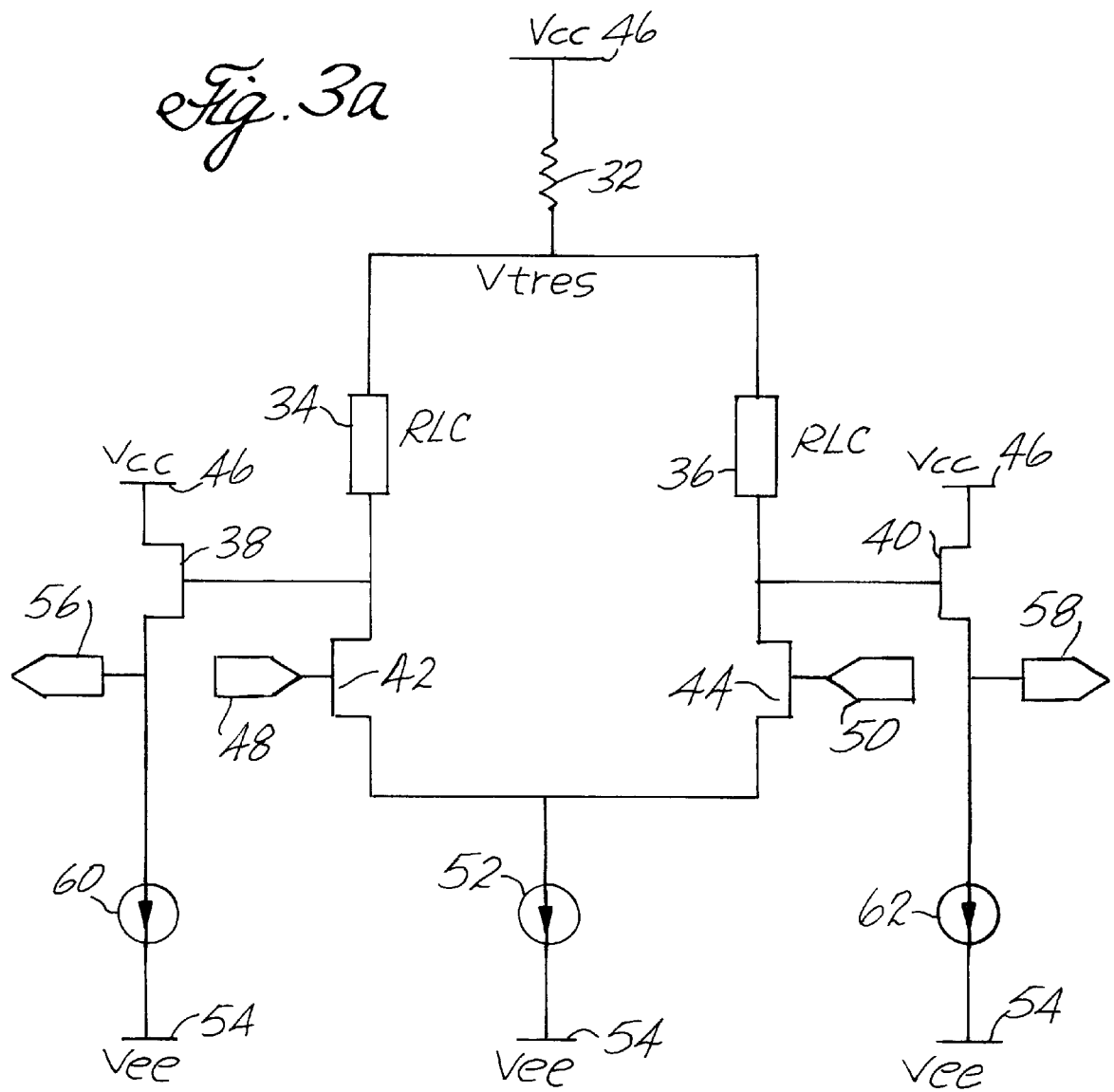
FIG. 3a shows a circuit schematic of the phase shifting delay cell of FIG. 1.

In one embodiment of the invention, the A cells and the S cell of FIG. 1 are implemented by fixed-value LC-tuned circuits. FIG. 3a illustrates a simplified schematic of a differential delay cell 30 (i.e., phase-shifting cell). Referring first to only half of the differential delay cell, an RLC tank 36 is coupled at one terminal to a power supply 46 by way of a resistor 32. A second terminal of the RLC tank is effectively coupled to a first of the differential input signals by an input FET 44. More specifically, the second terminal of the RLC tank is coupled to the drain of the input FET, with the input FET gate being provided the first differential input signal. The source of the first input FET is coupled to a current source 52. The second terminal of the RLC tank is also coupled to the gate of an output FET 40. The drain of the output FET is coupled to the power supply, the source is coupled to a current source 62, and the output of the phase shifting delay cell is taken from the source of the output FET. Accordingly, application of the first of the differential input signals to the input FET varies the current flowing through the RLC tank. This in turn causes the voltage across the first RLC tank to vary, with the variation in voltage dependent on the characteristics of the RLC tank.

Figure 3B:
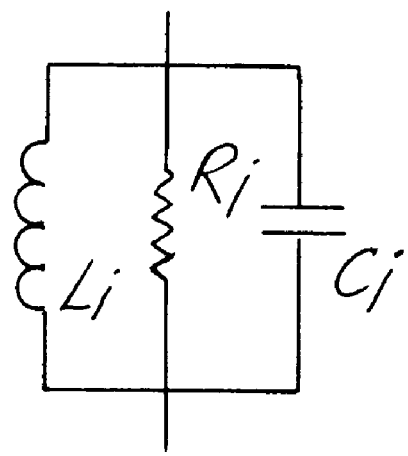
Figure 3C:
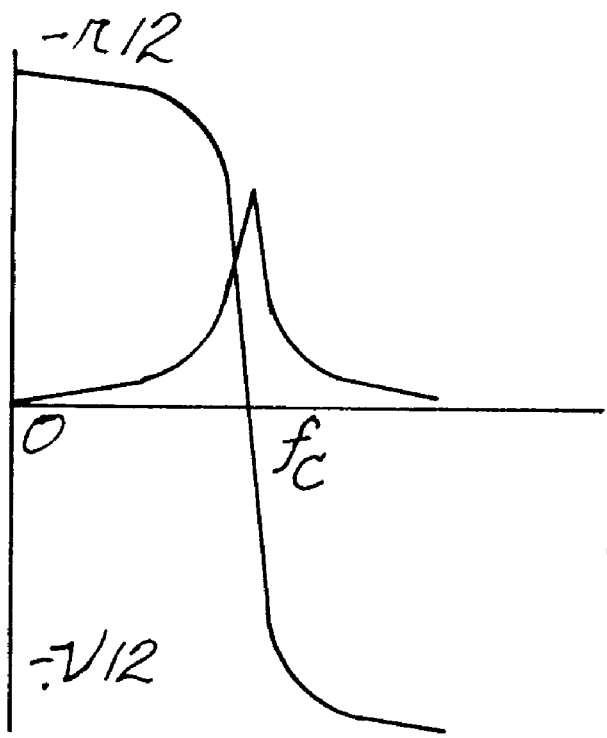

A schematic of the first RLC tank is shown in FIG. 3b. The RLC tank comprises, in parallel, an inductive component $L_i$ 71, a resistive component $R_i$ 73 and a capacitive component $C_i$ 75. The components of the RLC tank are selected such that the RLC tank is underdamped, and therefore has significant gain, i.e. a high Q value, at the tank's resonant frequency. In addition, the components are selected so that the RLC tank has a resonant frequency near a desired VCO center frequency. FIG. 3c shows a transfer function of the parallel RLC tank near its resonant frequency $f_c$. As illustrated, the transfer function exhibits a large phase shift with respect to small changes in frequency about the resonant frequency $f_c$. Thus, a small frequency change about the resonant frequency $f_c$, generates a relatively large phase shift in the output. In addition, the transfer function includes a large resonant peak, i.e., a high Q value. Thus, the amplitude of the output signal about the resonance frequency is much greater than about other frequencies. The RLC tank therefore operates as a bandpass filter filtering the input signal to decrease signal noise.

Further, the phase shifting delay cell of FIG. 3a is differential and includes additional elements. The additional elements are substantially matched with respect to the previously described elements. The additional elements include a second RLC tank 34. The second RLC tank has a terminal coupled to the power supply by resistor 32, and a second terminal coupled to the drain of a second input FET 42. To the gate of the second input FET is provided the second differential input, and the source is coupled to the current source 52. The drain of the second FET is coupled to the gate of a second output FET 38. The drain of the second output FET is coupled to a power supply, the source is coupled to a current source 60, and the second differential output 56 of the phase shifting delay cell is taken from the source.

The differential outputs of the phase shifting delay cell become differential inputs of a summing cell. Accordingly, different phase shifting delay cells have RLC tanks with different resonant frequencies. Thus, a first phase shifting cell utilizes an RLC tank with a resonant frequency greater than the desired VCO center frequency, and a second phase shifting cell with a resonant frequency less than the desired VCO center frequency. In addition, the components are selected so that the RLC tank has a resonant frequency near a desired VCO center frequency, when used in the PI VCO of FIG. 1.

Figure 4A:
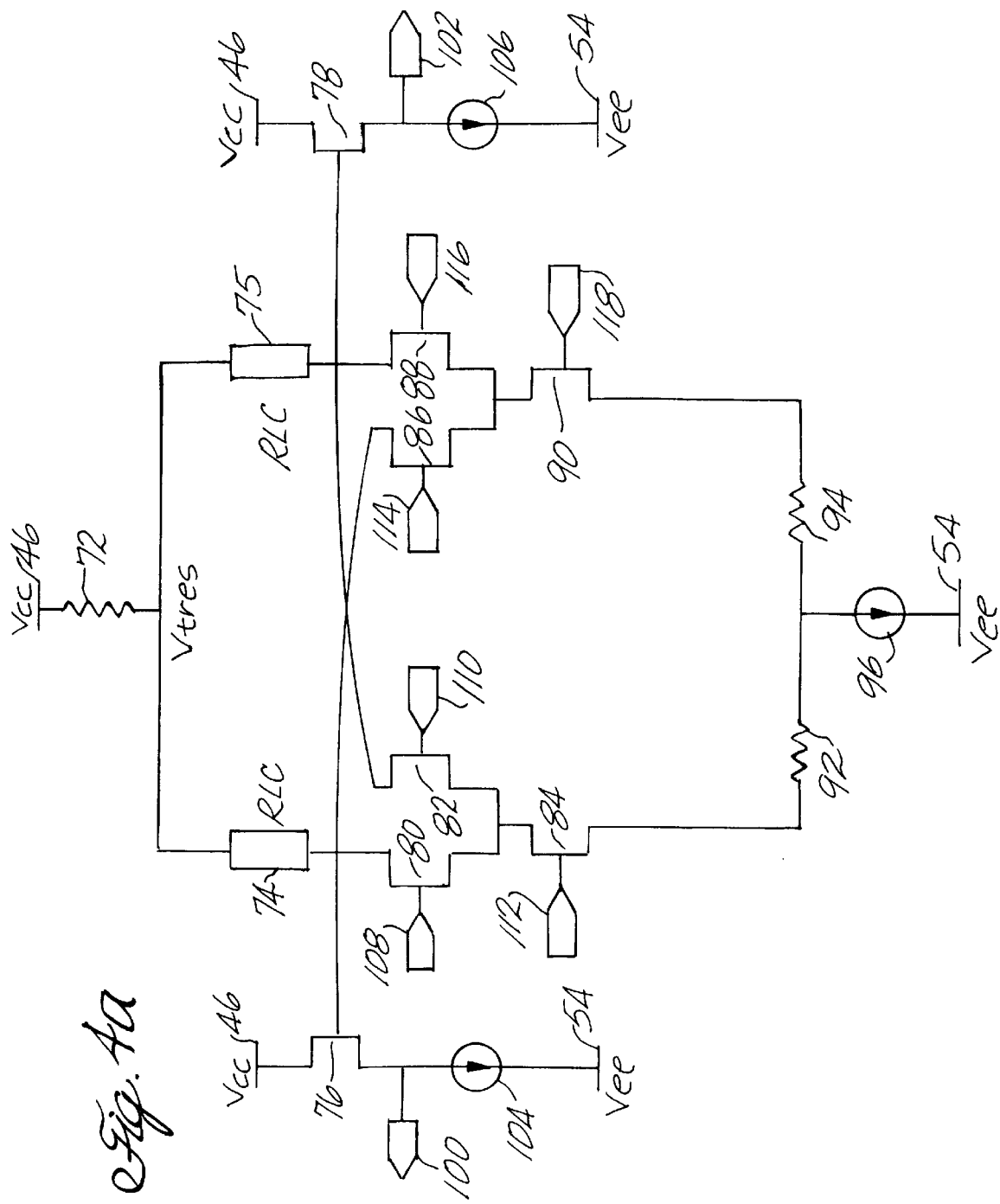
FIG. 4a shows a circuit schematic of the summing cell of FIG. 1.

FIG. 4a shows a schematic of a summing cell circuit 70, which in one embodiment is implemented in GaAs MESFET. The summing cell sums, in a weighted manner, differential inputs provided by two phase shifting delay cells and outputs a differential output signal. In performing the summing operation, the summing cell utilizes a low-Q shunt-peaking series RLC tank with a resonant frequency significantly higher than the resonant frequency of any of the phase shifting cells.

As may be seen in FIG. 4a, and referring first to only half of the summing cell, an RLC tank 75 is coupled at one terminal to a power supply via a resistor 72. A second terminal of the RLC tank 75 is coupled to an input from two different phase delay cells. More specifically, the second terminal is coupled to the drains of two input FETs 88 and 82, whose gates are provided inputs from different phase delay cells and whose sources are coupled via weighting FETs 84, 90, respectively, to a common current source 96.

Both input FET 88 and input FET 82 are coupled to the second terminal of the RLC tank, the current through the RLC tank is the sum of the current through the two input FETs. The current through, and thus the voltage across, the RLC tank is therefore a function of the currents through the input FET 88 and input FET 82. These currents are proportional to the input applied to the input FET 88, as in effect modified by a control input 118 to the gate of the weighting FET 90, and the input applied to the input FET 82, as in effect modified by a control input 112 to the gate of the weighting FET 112. Thus, a signal at the second terminal of the RLC tank is the weighted sum of the two input signals from different phase shifting cells.

Figure 4B:
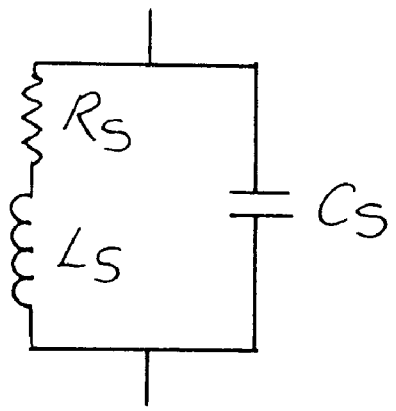

As previously indicated, if any phase shift provided by the summing cell is small, the relationship indicated by the vector diagram of FIG. 2 applies. Further, and as discussed with respect to the multiple phase interpolation cell of FIG. 5, increased numbers of phase shifting cells and summing cells may be used to increase the effective tuning range of the VCO if the summing cell provides little phase shift. Accordingly, the RLC tank is a series RLC tank as illustrated in FIG. 4*b*.

Figure 4C:
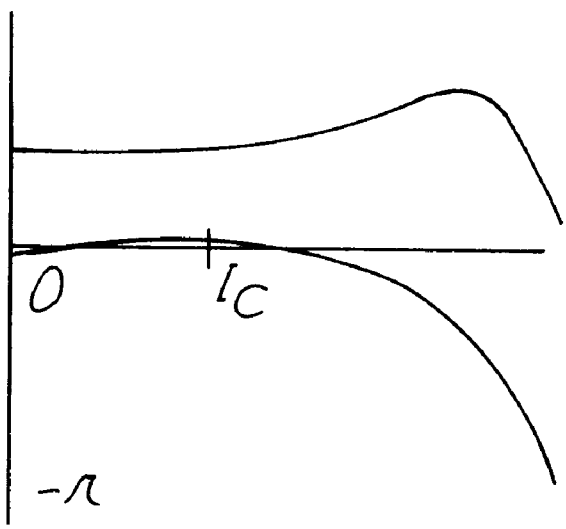
FIG. 4c shows the transfer function for the series RLC tank.

The RLC tank includes a resistive component, an inductive component, and a capacitive component. The capacitive component is in parallel with the resistive and inductive components, which are in series. The components are selected, as previously mentioned, such that the resonant frequency of the RLC tank is significantly greater than frequencies in the tuning range of the VCO. The RLC tank of the summing cell therefore has a transfer function as illustrated in FIG. 4*c*. In the range of frequencies approximate the VCO tuning range there is largely no phase shift, as well as a nearly flat phase versus frequency response, i.e., $\phi_s(\omega_0)=0$.

Further, the summing cell of FIG. 4*a* is differential and includes additional elements. The additional elements are substantially matched with respect to the previously described elements. The additional elements include a second RLC tank 74. The second RLC tank has a terminal coupled to the power supply by resistor 72, and a second terminal coupled to the drain of input FET 80 and input FET 86. The gates of input FET 80 and input FET 86 are provided differential inputs 108, 114, respectively. The sources of input FETs 80, 86 are coupled via weighting FETs 84, 90, respectively, to the common current source 96. The drains of FETs 80, 86 are coupled to the gate of an output FET 76. The drain of the output FET 76 is coupled to a power supply, the source is coupled to a current source 104, and the differential output 100 of the summing cell is taken from the source.

Figure 5:
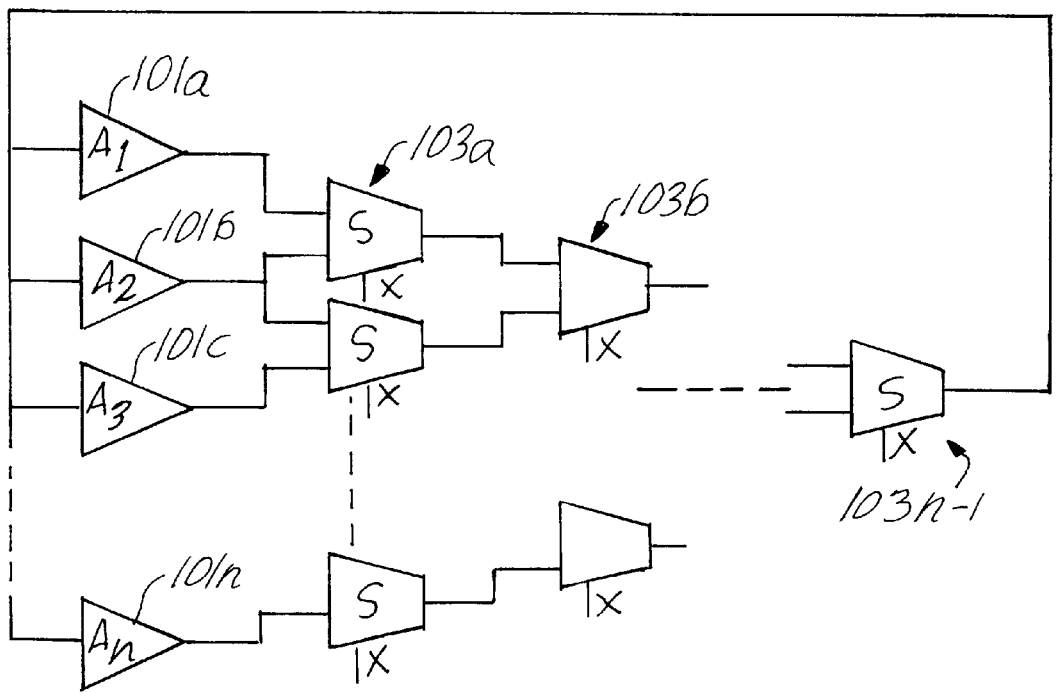
FIG. 5 shows an N-multiple PI VCO.

FIG. 5 illustrates a multiple phase interpolation VCO. The multiple phase interpolation VCO of FIG. 5 is similar to that of FIG. 1 in that it is comprised of phase delay cells and summing cells. In the multiple phase interpolation VCO of FIG. 5, however, more than two phase shifting delay cells and multiple summing cells are used. More specifically, the multiple phase interpolation VCO of FIG. 5 includes n phase shifting delay cells 101*a–n* and n−1 summing cells 103*a*–(n−1).

The phase shifting delay cells form a sequence of cells, with a first phase shifting delay cell 101*a* the first cell in the sequence, a second phase shifting delay cell 101*b* the second cell in the sequence, and an nth phase shifting delay cell 101*n* the nth cell in the sequence. Each cell has a resonant frequency which differs from the other cells. Thus, in one embodiment the difference in the resonant frequency between adjoining cells in the sequence is $\Delta f$ with each succeeding cell in the sequence having a resonant frequency $\Delta f$ greater than the resonant frequency of the preceding cell in the sequence. Thus, in one embodiment, assuming n cells, the tuning range of the of the VCO is centered around the resonant frequency $f_c$ of the cell in the middle of the sequence, and the tuning range is approximately $(f_c-\Delta f/2)$ to $f_c+\Delta f/2)$.

Each two adjoining phase shifting delay cells provide inputs to a summing cell. Further, with the exception of the first phase shifting cell and the last phase shifting cell in the sequence, the phase shifting cells each provide an input to two different summing cells. Accordingly, for every n phase shifting delay cells, there are n−1 summing cells receiving inputs from the phase shifting delay cells.

Each two summing cells further provide inputs to further summing cells. This is accomplished in a manner similar to the way in which the first set of summing cells receives inputs from the phase shifting delay cells. Accordingly, the phase shifting delay cells and the summing cells may be viewed as forming a triangular configuration (as illustrated in FIG. 5), with the phase shifting delay cells forming the base and a single summing cell forming the apex of the triangle. Interposed between the single summing cell forming the apex of the triangle and the phase shifting delay cells are a number of levels of summing cells. Accordingly, if there are n phase shifting delay cells in the multiple phase interpolation VCO, there are n−1 levels of summing cells and there are $$\sum_{1}^{i=n-1} n$$

summing cells.

In order to more fully explore the multiple phase interpolation VCO, operation of a subset of the multiple phase interpolation VCO FIG. 5 is explored. The subset of the multiple-phase-interpolation VCO FIG. 5 comprises three phase delay cells 101*a–c*, and 3 summing cells 103*a–c*. The first phase delay cell has an output provided to a first summing cell 103*a*. The second phase shifting cell 101*b* has an output provided both to the first summing cell 103*a* and a second summing cell 103*b*. The third phase shifting cell has an output provided to the second summing cell. Thus, the first summing cell receives inputs from the first and second phase shifting cells, and the second summing cell receives inputs from the second and third phase shifting cells.

The first summing cell and the second summing cell each provide an input to a third summing cell 103*c*. The third summing cell, in the subset of the embodiment described, provides its output as an input to the first, second and third phase shifting cells.

The operation of the phase shifting cells is as previously described with respect to FIG. 3. In the subset described, however, the third summing cell has a range of outputs greater than either the first phase shifting cell or the second phase shifting cell. In other words, the three phase shifting cells provide an increased range of resonant frequencies provided to the summing cells. The multi-level summing of summing cell output signals is possible, in part, due to the general lack of phase shift by the summing cells in the tuning range of VCO frequencies. In practice, however, variation in component tolerances, for example, may add some phase shift to the summing cells output, thereby limiting the possible number of levels of summing cells as well as the tuning range of the VCO.

The tuning range of the multiple phase interpolation VCO is largely determined by the number of phase shifting cells and the difference in frequency between resonant frequencies of each of the phase shifting cells. Thus, if each phase shifting cell has a resonant frequency greater than a resonant frequency of a phase shifting cell immediately prior in a sequence of cells, a three phase cell VCO will have an effective tuning range approximately twice that of a two phase shifting cell VCO. In a multiple phase interpolation VCO with n phase shifting cells, the effective tuning range will be approximately n times the tuning range of a two phase shifting cell VCO.

Thus, embodiments of the present invention provide phase interpolation VCOs. The VCOs of the present invention may be embodied in other specific forms without departing from the spirit or attributes of the present invention. It is therefore desired that the described embodiments be considered in all respects as illustrative and not restrictive, reference being made to the appended claims and their equivalents rather than the foregoing description to indicate the scope of the invention.

What is claimed is:

1. A voltage-controlled oscillator, comprising:
   a plurality of phase shifting cells producing phase shifted signals; and
   a plurality of interpolating cells for cumulatively summing the phase shifted signals.

2. The voltage-controlled oscillator of claim 1, wherein the phase shifting cell comprises:
   a first LC resonant circuit having a first terminal coupled to a voltage line and a second terminal coupled to a first terminal of a first transistor, the first transistor having a second terminal coupled to a current source, and a gate coupled to a first input;
   a second LC resonant circuit having a first terminal coupled to the voltage line and a second terminal coupled to a first terminal of a second transistor, the second transistor having a second terminal coupled to the current source, and a gate coupled to a second input.

3. The voltage-controlled oscillator of claim 1, wherein the interpolating cell comprises:
   a first interpolating cell LC resonant circuit having a first terminal coupled to a voltage line and a second terminal coupled to a first terminal of a first interpolating cell transistor, the first interpolating cell transistor having a second terminal coupled to a current source, and a gate coupled to a first interpolating cell input;
   a second interpolating cell LC resonant circuit having a first terminal coupled to the voltage line and a second terminal coupled to a first terminal of a second interpolating cell transistor, the second interpolating cell transistor having a second terminal coupled to the current source, and a gate coupled to a second interpolating cell input;
   a third transistor having a first terminal coupled to an output, a second terminal coupled to the current source and coupled to the second transistor, and a gate coupled to a third input; and
   a fourth transistor having a first terminal coupled to an output, a second terminal coupled to the current source and coupled to the first transistor, and a gate coupled to a fourth input.

4. A voltage controlled oscillator comprising:
   a plurality of phase shifting cells, each of the phase shifting cells receiving a common input signal and outputting a phase shifted output signal which is phase shifted with respect to the common input signal, the phase shifted output signal from each phase shifting cell being phase shifted different amounts than phase shifted output signals from other phase shifting cells; and
   at least one summing cell receiving the phase shifted output signals of at least two phase shifting cells, the summing cells outputting a signal representative of the sum of the phase shifted output signals; and
   wherein there are n phase shifting cells and n−1 levels of summing cells; and
   wherein a first level of the n−1 levels of summing cells receives the phase shifted output signals and the remaining levels of the summing cells receive signals representative of the sum of the phase shifted output signals.

5. A voltage controlled oscillator providing an oscillating signal, the frequency of the oscillating signal being controllable within a tuning range of frequencies about a center frequency, the voltage controlled oscillator comprising:
   a first phase shifting cell receiving the oscillating signal and outputting a first phase shifted output signal, the first phase shifted output signal being phase shifted a positive amount with respect to the oscillating signal;
   a second phase shifting cell receiving the oscillating signal and outputting a second chase shifted output signal, the second phase shifted output signal being phase shifted a negative amount with respect to the oscillating signal;
   a summing cell receiving the first phase shifted output signal and the second chase shifted output signal and outputting the oscillating signal, the oscillating signal being based on a summation of the first phase shifted output signal and the second phase shifted output signal;
   wherein the first phase shifting cell comprises a first LC tank, the first LC tank having a resonant frequency less than the center frequency, and wherein the second phase shifting cell comprises a second LC tank, the second LC tank having a resonant frequency greater than the center frequency;
   wherein the summing cell comprises a summing cell LC tank, the summing cell LC tank having approximately zero phase shift about the center frequency;
   wherein the summing cell LC tank has a resonant frequency greater than the center frequency; and
   wherein the first LC tank and the second LC tank are parallel LC tanks, and the summing cell LC tank is a series LC tank.

6. The voltage controlled oscillator of claim 5 wherein the summing cell comprises a modified Gilbert cell, the modification being the use of an LC tank at a summing node of the Gilbert cell.

7. A voltage controlled oscillator comprising:
   a plurality of n phase shifting cells, with n at least 3, each of the phase shifting cells receiving a common input signal and outputting a phase shifted output signal which is phase shifted with respect to the common input signal, the phase shifted output signal from each phase shifting cell being phase shifted different amounts than phase shifted output signals from other phase shifting cells; and
   a plurality of summing cells receiving the phase shifted output signals of at least two phase shifting cells, the summing cells outputting signals representative of the sum of the phase shifted output signals.

* * * * *

UNITED STATES PATENT AND TRADEMARK OFFICE
CERTIFICATE OF CORRECTION

PATENT NO. : 6,204,733 B1
DATED : March 20, 2001
INVENTOR(S) : Yijun Cai

It is certified that error appears in the above-identified patent and that said Letters Patent is hereby corrected as shown below:

Column 3,
Line 36, replace "xa1" with -- $xa_1$ --.

Column 4,
Line 9, after "frequency $f_c$ Thus" with -- frequency $f_c$. Thus --.

Column 5,
Line 43, after "n-1" insert -- levels of --.
Line 56, delete "of the" (second occurrence).

Column 8,
Lines 16 and 21, replace "second chase shifted" with -- second phase shifted -- (both occurrences).

Signed and Sealed this

Twenty-sixth Day of November, 2002

*Attest:*

*Attesting Officer*

JAMES E. ROGAN
*Director of the United States Patent and Trademark Office*